(12) United States Patent
Anderson

(10) Patent No.: US 6,657,490 B2
(45) Date of Patent: Dec. 2, 2003

(54) FEEDFORWARD SIGNAL GENERATION FOR COMBINED AMPLIFIERS

(75) Inventor: Dale Anderson, Colleyville, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/108,602

(22) Filed: Mar. 28, 2002

(65) Prior Publication Data

US 2003/0184375 A1 Oct. 2, 2003

(51) Int. Cl.[7] .................................................. H03F 3/04
(52) U.S. Cl. .................... 330/124 R; 330/149; 330/151
(58) Field of Search .............................. 330/124 R, 149, 330/151

(56) References Cited

U.S. PATENT DOCUMENTS

| 4,583,049 | A |   | 4/1986 | Powell ........................ 330/151 |
| 4,595,882 | A | * | 6/1986 | Silagi et al. ................. 330/151 |
| 5,117,197 | A | * | 5/1992 | Hsu et al. .................... 330/149 |
| 6,388,518 | B1 | * | 5/2002 | Miyatani .................... 330/149 |

FOREIGN PATENT DOCUMENTS

JP          2237727 A   *  8/2002

OTHER PUBLICATIONS

Danyuk et al. "Feedforward Amplifiers Incorporate Parallel Output Summing" IEEE Transactions on Circuits and Systems I vol. 41, Issue 12 Dec. 1994 pp. 912–915.*

* cited by examiner

Primary Examiner—Michael B. Shingleton
(74) Attorney, Agent, or Firm—Posz & Bethards, PLC; Charles W. Bethards

(57) ABSTRACT

A feedforward amplifier circuit (30) compensates for distortion introduced into an amplified input carrier signal (34) by amplifying and feedforwarding a distortion signal component from one or more of the amplifiers (32a–32n) in an amplifier array (32) used to amplify the input carrier signal (34). Specifically, a main power amplifier (31) includes a plurality of combined power amplifiers (32a–32n) for amplifying the input carrier signal (34) to create an amplified carrier signal with a carrier signal component and a distortion signal component. The amplified carrier signal (34) is amplified on a main output path. A feedforward error path coupled to an output of at least one of the plurality of combined power amplifiers (32a–32n) receives a coupled amplified carrier signal output from the at least one of the plurality of combined power amplifiers (32a–32n), cancels a corresponding carrier signal component from the coupled amplified carrier signal, and feedforwards the remaining distortion signal component of the coupled amplified carrier signal to the main output path to cancel the distortion signal component from the amplified carrier signal.

22 Claims, 2 Drawing Sheets

FEEDFORWARD SIGNAL GENERATION FOR COMBINED AMPLIFIERS

BACKGROUND OF THE INVENTION

1. Field of the Invention

The present invention relates to power amplifiers, and specifically to a power amplifier circuit including a feedforward error path coupled to an output of at least one of a plurality of combined power amplifiers for canceling the distortion signal component from a carrier signal output from the plurality of combined amplifiers.

2. Description of Related Art

Wireless infrastructure equipment providers design high power linear amplifier circuits to amplify envelope modulated signals in, for example, wireless communications base stations. In such a design, a feedforward amplifier circuit can be employed to compensate for distortion added to a carrier signal as a result of its amplification. In such a circuit, an input modulated signal will be split into two signal paths—a main output path and an error path. The signal component coupled onto the main output path is amplified and then delayed before it is output from the amplifier circuit. The signal component on the error path is delayed by a predetermined amount to cancel the carrier signal component from a portion of the amplified main path signal component that is coupled to the error path. The remaining distortion signal component is then amplified and delayed by a predetermined amount before being recombined with the amplified signal component to compensate for the distortion therein due to, for example, nonlinear transconductance (if a FET device is used as the amplifier), junction capacitance and the saturation effects of the amplifier that result in signal clipping.

In conventional feedforward amplifier circuit designs, it is desirable to delay match the main output path signal with the error path signal by placing an error transmission delay (ETD) block between the output of the main amplifier and the amplified signal output coupler to the error path. Because this ETD block is designed to match the error path propagation delay, and because of the low losses, small size and requisite delays necessary for such error matching, the ETD block is typically implemented with a filter having several high Q poles of selectivity, where Q represents the quality factor of the resonators used to realize the filter.

Microstrip lines have been used in the past for the delay element in both the main path and the error path. However, for a feedforward linear power amplifier (LPA) circuit operating at frequencies greater than 800 MHz, the transmission loss associated with microstrip lines is too high for cost effective implementation. In addition, as quarter-wavelength microstrip lines may be used to create resonators having Qs in the hundreds, it is impractical to use such devices to implement a filter with a Q in the tens of thousands as is necessary with the above-discussed feedforward amplifier circuit.

One practical way to implement such a high Q filter is to use quarter-wavelength coaxial resonators made from silver-plated machined metal blocks. However, even with this type of filter, several resonators are required to create a filter with a high enough Q to generate a requisite main path delay that in typical applications is approximately 10 ns.

BRIEF DESCRIPTION OF THE DRAWINGS

Objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

Figure 1:
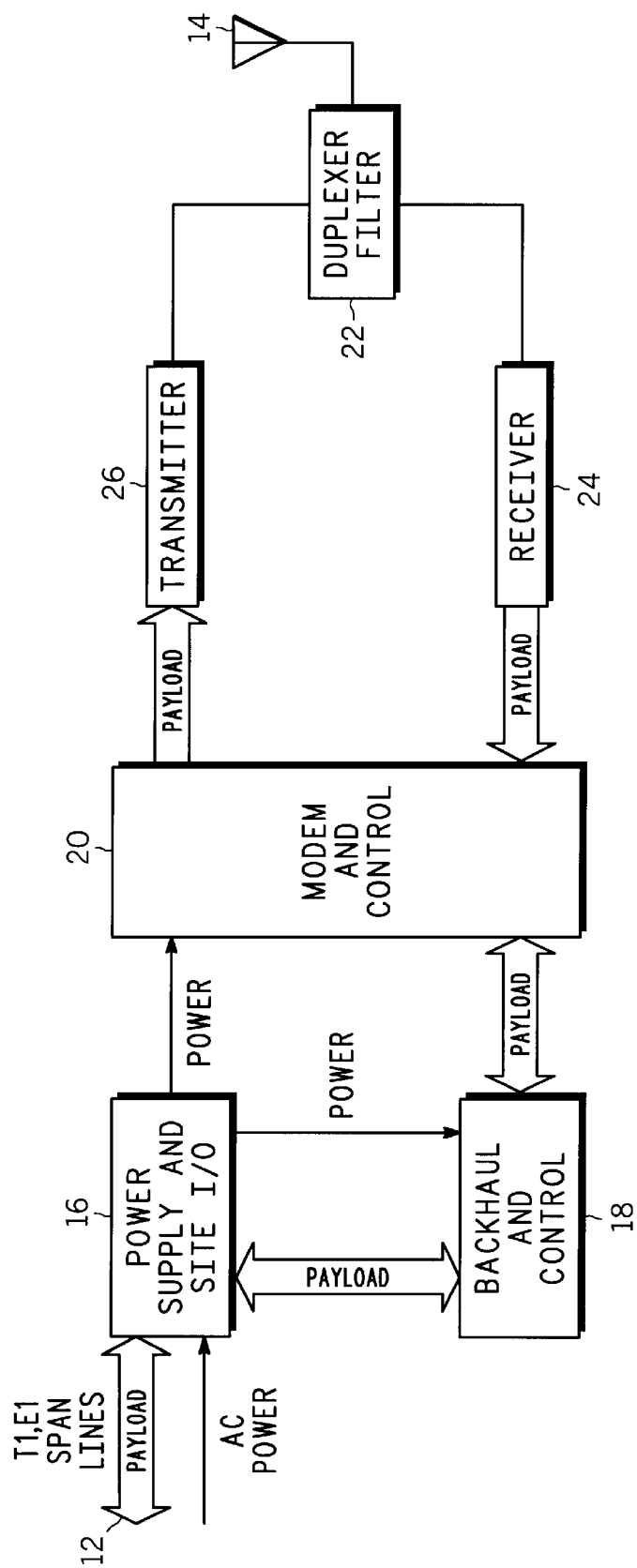
FIG. 1 is a block diagram of an exemplary wireless communications base station in which a feedforward power amplifier circuit according to the present invention may be implemented.

Referring now to the drawings in which like numerals reference like parts, FIG. 1 shows an exemplary wireless communications base station (base station) 10. While the actual structural makeup of such a base station will vary, the base station 10 will be referred to for purposes of discussing an exemplary environment in which various embodiments of a feedforward power amplifier circuit according to the present invention may be implemented.

As is well known, the base station 10 is generally coupled to a landline link such as, for example, T1 or E1 span lines 12 that enable the base station 10 to connect wireless communications received by a base station antenna 14 to the public switch (not shown) and vice versa. The base station 10 generally includes a power supply for converting AC power to and providing appropriate DC power to the various elements of the base station and a site input/output processor shown generally at 16 for facilitating input/output with a backhaul and control computer 18. The backhaul and control computer 18 is for controlling and processing communications over the span lines 12 as well as communications with and operation of a modem and control computer 20. The modem and control computer 20 is for facilitating receipt, transmission and processing of communications signals from a base station receiver 24 and for a base station transmitter 26 that are inter-coupled through a duplexer 22 to the base station antenna 14. The base station transmitter 26, preferably, includes, implements, and utilizes a preferred embodiment of a power amplifier circuit according to the present invention.

Figure 2:
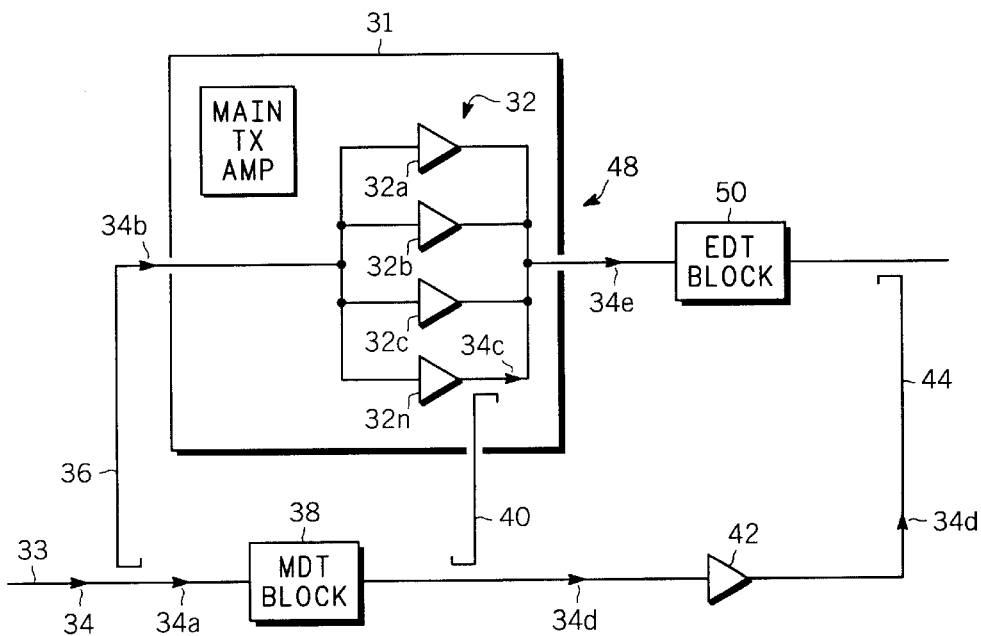
FIG. 2 is a block diagram of a feedforward power amplifier circuit according to an exemplary embodiment of the present invention.

FIG. 2 shows an exemplary embodiment of a feedforward power amplifier circuit 30 according to the present invention. As will be discussed below in detail, the feedforward power amplifier circuit 30 includes a main amplifier 31 with an amplifier array 32 of N combined amplifiers 32*a*–32*n* (N is a positive integer >1, and n varies depending upon the value of N) that are preferably combined in parallel and that are each of a predetermined type such as, for example multi-stage GaAs RFICs manufactured by Raytheon Corporation. However, any array of parallel-combined amplifiers, such as an array of high voltage ICs manufactured using LDMOS technology and soldered onto a PC board, may be used. The feedforward power amplifier circuit 30 is capable of linearly amplifying any carrier signal independent of the modulation and type of signal. However, it is contemplated that the feedforward power amplifier circuit 30 may be utilized in a base station such as the base station 10 to linearly amplify carrier signals such as, for example, WCDMA, IS-95 CDMA, multicarrier GSM, EDGE or any other like communications signals with varying modulation envelopes within the range of about 800 MHz to PCS (1.9 GHz) independent of the particular air interface. The feedforward power amplifier circuit 30 may be implemented in a base station such as the base station 10 in FIG. 1 to produce a linear amplified carrier signal in the range of, for example, about 30–40 W.

The feedforward power amplifier circuit 30 includes an input 33 for receiving an input carrier signal 34 of the type discussed above. A power splitter 36, which may be, for example, a hybrid combiner such as a Wilkinson combiner, a coupler such as a 3 dB, 10 dB or 20 dB coupler, or any other passive linear time invariant multi-port device designed to split power among its ports, splits the input carrier signal 34 into a first signal component, referred to hereinafter as an error path signal component 34a, for transmission on an error signal path, and a not necessarily equal power second signal component, referred to hereinafter as a main path signal component 34b, for transmission on a main signal path including the power splitter 36, the main amplifier 31, and a coupler 40.

The error path signal component 34a is delayed via a main timing delay (MTD) block 38, which may be, for example, a predetermined length of coaxial cable or a high Q filter, and which has an associated delay that compensates for the delay in the main path that can typically range from 10–50 nanoseconds. The coupler 40 couples an amplified output signal 34c from one or a plurality of the N amplifiers, such as the amplifier 32n, in the amplifier array 32 to the error signal path. Preferably, the amplifier 32n is physically closest to the error path, thereby minimizing delay due to the transmission path of the coupler 40. When the error path signal component 34a, which is delayed by the MTD block 38, and the amplified output signal 34c, which includes both a carrier signal component and a distortion component created by the amplifier 32n, are combined, the carrier signal components of the signals are cancelled. An error amplifier 42 then amplifies the remaining distortion signal component 34d and outputs it to a re-insertion passive splitter/combiner 44, which can be of the same type as the power splitter 36. As will be discussed below in more detail, the re-insertion passive splitter/combiner 44 then re-inserts the amplified distortion signal component 34d back into the main signal path after and at the output of an EDT 50 thereby canceling or offsetting distortion components in the main path signal that were caused or generated by the main transmitter amplifier 31.

Still referring to FIG. 2, the main path signal component 34b is input into the main amplifier 31 subsequent to being split by the power splitter 36 and is then amplified by the amplifier array 32. Although not shown, the main path signal component 34b may also be passively attenuated or phase shifted by an attenuator or phase shifter based on an input control voltage set, for example, by an operator at a test bench during circuit assembly, or may be otherwise conditioned based on input requirements of the main amplifier 31. An output power combiner 48, such as a Wilkinson combiner, then combines the resulting amplified signals from each of the amplifiers 32a–32n in the amplifier array 32 into a single amplified main path output signal 34e. The amplified main path output signal 34e is then coupled to and delayed by an error delay-timing (EDT) block 50 to provide an output signal that is a delayed version of the main path output signal 34e on the main signal path from the EDT. The EDT block 50 includes, for example, a high Q filter having an unloaded resonator Q of less than 50,000 or a predetermined length of low loss coaxial cable for signal delay purposes. Since the amplified output signal 34c from the amplifier 32n is coupled to the error signal path by the coupler 40 and therefore to the error amplifier 42 the distortion signal component 34d will be proportional to the distortion signal component of the amplified main path output signal 34e and thus tend to cancel or offset the distortion when reinserted at the coupler 44, provided the path delay experienced by distortion signal component 34d and the main path output signal 34e are substantially equal.

The path delay experienced by the main path output signal is largely the combination of the delay introduced by the combiner 48 plus the delay from the EDT block 50. The path delay experienced by the distortion signal component is the delay through the coupler 40 or more generally a combiner (not specifically shown) combining a number M of the amplifier outputs in the array of amplifiers, where the number M is less than the total number of amplifiers n or N, plus the delay through the error amplifier 42 and coupler 44. Generally the delay through a combiner, other parameters such as Q being equal, will be proportional to the number of signals being combined. Since an array of amplifiers is being used their outputs must necessarily be combined with the combiner 48 and this will introduce a path delay to the main path output signal 34e that is greater than the path delay experienced by the distortion component signal or the amplified output signal 34c as a result of the coupler 40 or M signal combiner (not shown). Given this the path delay requirements for the EDT block 50 are reduced from what would otherwise be required in a conventional system. If the delay required from the EDT block 50 has been decreased the loss due to or resulting from the EDT will be reduced as the number of poles to provide the delay for a given Q will be decreased. Generally, since the amplified output signal 34c can be generated from the output of a smaller group of M amplifiers ($1 \leq M < N$) the number of poles in the EDT block 50 can be reduced in proportion to the incremental or relatively larger amount of propagation delay introduced by the output power combiner 48. This incremental propagation delay, which is equal to the difference between the propagation delay of a combiner for M combined devices and the propagation delay of a combiner 48 for N combined devices, results in lower associated loss and as much as a 30%–50% reduction in cost for high power coupler and/or delay components required to implement the EDT block 50. In addition, the resulting reduction in loss at the EDT block 50 consequently offsets some of the transmission loss that may be, for example, about 0.5 dB, introduced by the output power combiner 48 that combines the respective outputs of the amplifiers 32a–32n.

Further, the layout of a single component side/single board that generates a carrier cancellation output from a smaller number of M combined devices exhibits an associated shorter total propagation delay through the error path, thereby further reducing delay requirements for the EDT block 50. Test measurements conducted using a feedforward power amplifier circuit 30 resulted in a 30% reduction in propagation delay (from 10 ns to 7 ns) in the EDT block 50 and 5%–7% more output power from the feedforward power amplifier circuit 30.

Figure 3:
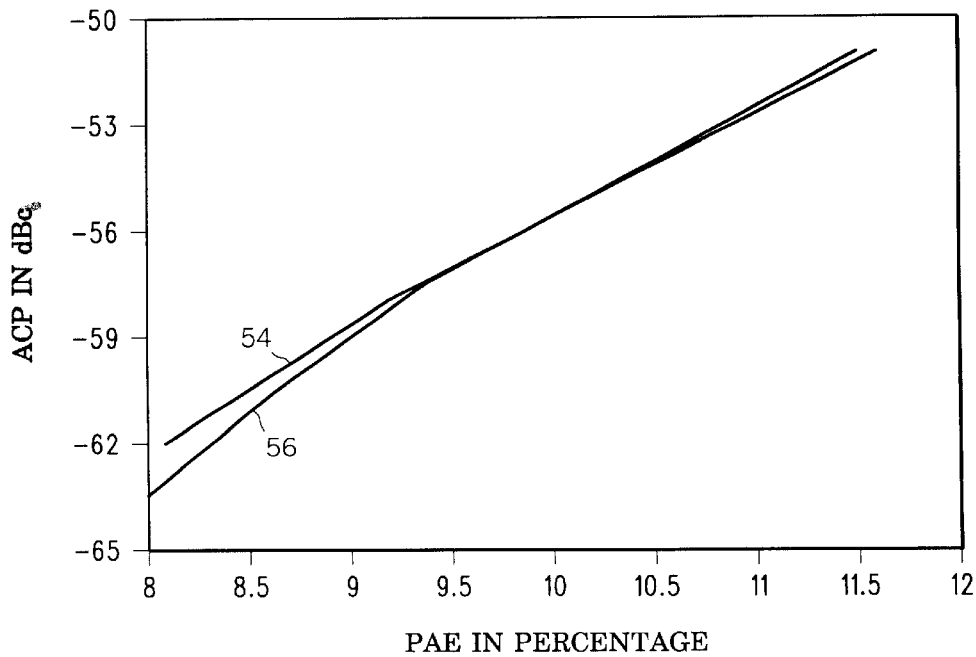
FIG. 3 is an exemplary graph comparing linearity versus power-added efficiency performance when a feedforward power amplifier circuit according to the present invention is used, and when the feedforward power amplifier circuit is not used.

FIG. 3 is an exemplary graph comparing linearity versus power-added efficiency performance when a feedforward power amplifier circuit according to the present invention is used, and when the feedforward power amplifier circuit is not used. The FIG. 3 performance graph 52 of adjacent channel power (ACP), a measure of amplified output signal linearity, versus power-added efficiency (PAE) compares the effectiveness of the feedforward system using M<N amplifiers of the array of amplifiers versus using all N amplifiers to provide the signal that is feed forward. Note this is the difference between using the amplified output signal 34c in the first case and using an amplified main path output signal such as 34e in the latter case to generate the distortion signal component 34d. The performance represented by the line 54 results when the amplified output signal 34c, as generated by, for example, four amplifiers in the amplifier array 32 of the feedforward power amplifier circuit 30 in FIG. 2, is used to generate the distortion signal component 34d. Whereas the performance represented by the line 56 results when the amplified main path output signal 34e, as generated by all amplifiers in the amplifier array 32, is used to generate the distortion signal component 34d. The performance graph 52 indicates that the performance in either case 54, 56 is about the same for amplifier efficiencies in the range of approximately 9–11.5%. The exemplary feedforward amplifier tested would typically be operated in a base station, such as the base station 10 in FIG. 1, at an efficiency point of about 10–10.5%.

However, while the variation in the above performance 54, 56 is small, the difference in the cost of an EDT block 50 suitable for the different performance scenarios is significant and estimated to be approximately 40%. When the amplified output signal 34c, based on for example 4 amplifiers, is used to generate the distortion signal component 34d, the number of poles that are required in the high Q filter of the EDT block is reduced. More specifically, eight (8) poles are required when the amplified main path output signal 34e is used (performance 56), whereas only three (3) poles are required when the amplified output signal 34c is used (performance 54). Therefore, the feedforward power amplifier circuit 30 clearly provides circuit design advantages from a cost standpoint.

While the above description is of the preferred embodiment of the present invention, it should be appreciated that the invention may be modified, altered, or varied without deviating from the scope and fair meaning of the following claims.

What is claimed is:

1. An amplifier circuit, comprising:
   an input for receiving a carrier signal;
   a main power amplifier including a plurality of combined power amplifiers for amplifying the carrier signal to create an amplified carrier signal with a carrier signal component and a distortion signal component;
   a main output path for outputting the amplified carrier signal; and
   a feedforward error path coupled to an output of at least one but less than all of the plurality of combined power amplifiers for receiving a coupled amplified carrier signal output from the at least one but less than all of the plurality of combined power amplifiers, for canceling a corresponding carrier signal component from the coupled amplified carrier signal, and for feedforwarding a remaining distortion signal component to the main output path to cancel the distortion signal component from the amplified carrier signal.

2. The amplifier circuit of claim 1, wherein the feedforward error path is coupled to an output of one of the plurality of combined power amplifiers that is closest to the feedforward error path.

3. The amplifier circuit of claim 1, wherein the feedforward error path is coupled to outputs of certain of the plurality of combined power amplifiers that are closest to the feedforward error path.

4. The amplifier circuit of claim 1, wherein the main output path includes an error delay timing block for introducing a main path delay to the amplified carrier signal.

5. The amplifier circuit of claim 4, wherein the error delay timing block includes a predetermined length of low loss coaxial cable.

6. The amplifier circuit of claim 4, wherein the error delay timing block includes a high Q filter.

7. The amplifier circuit of claim 6, wherein the high Q filter has an unloaded resonator Q of less than 50,000.

8. The amplifier circuit of claim 4, wherein the feedforward error path includes a main delay timing block for introducing an error path delay to the coupled carrier signal, the error path delay corresponding to the main path delay introduced to the amplified carrier signal by a propagation delay of the main power amplifier.

9. The amplifier circuit of claim 8, wherein the main delay timing block is for introducing an error path delay to the coupled carrier signal prior to a point at which the feedforward error path is coupled to the main output path.

10. The amplifier circuit of claim 1, wherein the feedforward error path includes an error amplifier for linearly amplifying the remaining distortion signal component of the coupled amplified carrier signal to enable the remaining distortion signal component of the coupled amplified carrier signal to correspond to an inverse of the distortion signal component of the amplified carrier signal.

11. The amplifier circuit of claim 10, wherein the plurality of combined power amplifiers are combined in parallel through an output power combiner for enabling outputs from each of the plurality of combined power amplifiers to produce the amplified carrier signal.

12. The amplifier circuit of claim 11, further comprising a feedforward coupler embedded in the output power combiner for coupling an output of the at least one but less than all of the plurality of combined power amplifiers to the feedforward error path.

13. The amplifier circuit of claim 11, further comprising an error delay-timing block for delaying the amplified carrier signal by a predetermined amount to match a delay introduced by the feedforward error path;
   wherein the output power combiner introduces a propagation delay to the amplified carrier signal that reduces delay requirements of the error delay timing block.

14. An amplifier circuit, comprising:
   a plurality of combined power amplifiers for amplifying an input carrier signal and for consequently outputting an amplified carrier signal with both a carrier signal component and a distortion signal component introduced by the plurality of combined power amplifiers;
   a feedforward error path for canceling the distortion signal component from the amplified carrier signal based on the input carrier signal and an output of at least one but less than all of the plurality of combined power amplifiers; and
   a feedforward coupler for coupling the output of the at least one but less than all of the plurality of combined power amplifiers to the feedforward error path.

15. The amplifier circuit of claim 14, wherein the feedforward coupler is for coupling the output of one of the plurality of combined power amplifiers that is closest to the feedforward error path.

16. The amplifier circuit of claim 14, wherein the feedforward coupler is for coupling outputs of ones of the plurality of combined power amplifiers that are closest to the feedforward error path.

17. The amplifier circuit of claim 14, further comprising an error delay timing block for introducing a propagation delay to the amplified carrier signal to compensate for a delay introduced by the feedforward error path.

18. The amplifier circuit of claim 17, wherein the error delay timing block includes one of a predetermined length of low loss coaxial cable and a high Q filter.

19. The amplifier circuit of claim 17, further comprising an output power combiner for combining outputs from each of the plurality of combined power amplifiers to produce the amplified carrier signal, and for introducing a propagation delay to the amplified carrier signal that reduces delay requirements of the error delay timing block.

20. The amplifier circuit of claim 19, wherein the feedforward coupler is embedded in the output power combiner for coupling the output of the at least one but less than all of the plurality of combined power amplifiers to the feedforward error path.

21. An amplifier circuit, comprising:
   a plurality of parallel coupled power amplifiers for amplifying an input carrier signal and for providing an amplified carrier signal with both a carrier signal component and a distortion signal component introduced by the plurality of parallel coupled power amplifiers;
   a feedforward error path for canceling the distortion signal component from the amplified carrier signal based on the input carrier signal and an output of only one of the plurality of parallel coupled power amplifiers; and
   a feedforward coupler for coupling the output of the only one of the plurality of parallel coupled power amplifiers to the feedforward error path.

22. The amplifier circuit of claim 14, wherein the feedforward coupler is for coupling the output of the only one of the plurality of combined power amplifiers that is closest to the feedforward error path.

* * * * *